(12) United States Patent
Yang et al.

(10) Patent No.: US 12,144,124 B2
(45) Date of Patent: Nov. 12, 2024

(54) LOW-ROUGHNESS SURFACE-TREATED COPPER FOIL WITH LOW BENDING DEFORMATION, COPPER CLAD LAMINATE COMPRISING SAME, AND PRINTED WIRING BOARD

(71) Applicant: Lotte Energy Materials Corporation, Jeollabuk-do (KR)

(72) Inventors: Chang Yol Yang, Jeollabuk-do (KR); Jung Woo Seo, Jeollabuk-do (KR); Kideok Song, Jeollabuk-do (KR); Sunhyoung Lee, Jeollabuk-do (KR)

(73) Assignee: Lotte Energy Materials Corporation, Jeollabuk-do (KR)

( * ) Notice: Subject to any disclaimer, the term of this patent is extended or adjusted under 35 U.S.C. 154(b) by 0 days.

(21) Appl. No.: 18/275,329

(22) PCT Filed: Jan. 11, 2022

(86) PCT No.: PCT/KR2022/000439
§ 371 (c)(1),
(2) Date: Aug. 1, 2023

(87) PCT Pub. No.: WO2022/191402
PCT Pub. Date: Sep. 15, 2022

(65) Prior Publication Data
US 2024/0121902 A1    Apr. 11, 2024

(30) Foreign Application Priority Data
Mar. 11, 2021  (KR) .................. 10-2021-0032133

(51) Int. Cl.
*B32B 3/10* (2006.01)
*C25D 3/38* (2006.01)
(Continued)

(52) U.S. Cl.
CPC ................. *H05K 3/38* (2013.01); *C25D 3/38* (2013.01); *C25D 5/48* (2013.01); *C25D 9/04* (2013.01);
(Continued)

(58) Field of Classification Search
CPC ..................................... H05K 3/382
See application file for complete search history.

(56) References Cited

U.S. PATENT DOCUMENTS 6,194,056 B1    2/2001  Sakai et al.
11,622,445 B2 *  4/2023  Yoon ............... H05K 3/022
                                                  428/457

(Continued)

FOREIGN PATENT DOCUMENTS

JP    2003-268567 A    9/2003
JP    2016-149438 A    8/2016
(Continued)

OTHER PUBLICATIONS

Notice of Allowance from forresponding Korean Patent Application No. 10-2021-0032133, dated Jan. 26, 2023.
(Continued)

*Primary Examiner* — Elizabeth E Mulvaney
(74) *Attorney, Agent, or Firm* — Harness, Dickey & Pierce, P.L.C.

(57) ABSTRACT

The present invention relates to a surface-treated copper foil, which has excellent adhesive strength with a resin substrate, shows low bending deformation after adhesion with a resin substrate, and is suitable as a high-frequency foil due to its low transmission loss, to a copper clad laminate comprising same, and to a printed wiring board.

10 Claims, 10 Drawing Sheets

(51) Int. Cl.
    *C25D 5/48*           (2006.01)
    *C25D 9/04*           (2006.01)
    *H05K 1/03*           (2006.01)
    *H05K 3/18*           (2006.01)
    *H05K 3/38*           (2006.01)

(52) U.S. Cl.
    CPC ............. *H05K 1/032* (2013.01); *H05K 3/188* (2013.01); *H05K 2201/0355* (2013.01)

(56) References Cited

U.S. PATENT DOCUMENTS

| | | |
|---|---|---|
| 2003/0235711 A1 | 12/2003 | Seido et al. |
| 2009/0095515 A1* | 4/2009 | Sakai .................. C25D 7/0614 428/607 |
| 2009/0136725 A1 | 5/2009 | Shimokawa et al. |
| 2019/0364664 A1 | 11/2019 | Beom et al. |
| 2021/0195737 A1 | 6/2021 | Yoon et al. |

FOREIGN PATENT DOCUMENTS

| | | |
|---|---|---|
| JP | 2016-160503 A | 9/2016 |
| JP | 7064563 B2 | 5/2022 |
| KR | 10-2013-0132111 A | 12/2013 |
| KR | 10-2016-0099439 A | 8/2016 |
| KR | 10-2017-0015111 A | 2/2017 |
| KR | 10-2018-0085086 A | 7/2018 |
| KR | 10-2019-0135878 A | 12/2019 |
| WO | WO-2010/110092 A1 | 9/2010 |

OTHER PUBLICATIONS

International Seach Report from corresponding PCT Application No. PCT/KR2022/000439, dated Apr. 19, 2022.

Office Action from corresponding Japanese Patent Application No. 2023-546150, dated Oct. 1, 2024.

* cited by examiner

LOW-ROUGHNESS SURFACE-TREATED COPPER FOIL WITH LOW BENDING DEFORMATION, COPPER CLAD LAMINATE COMPRISING SAME, AND PRINTED WIRING BOARD

CROSS-REFERENCE TO RELATED APPLICATIONS

This application is a national phase application of PCT Application No. PCT/KR2022/000439, filed on 11 Jan. 2022, which claims the benefit and priority to Korean Patent Application No. 10-2021-0032133, filed 11 Mar. 2021. The entire disclosures of the applications identified in this paragraph are incorporated herein by references.

TECHNICAL FIELD

The present disclosure relates to a surface-treated copper foil and, more specifically, to a surface-treated copper foil that exhibits superb peel strength to a resin substrate and low warpage after adhesion to the resin substrate and is suitable as a high-frequency foil due to the low transmission loss thereof, and a copper clad laminate and a printed wiring board, each including same.

BACKGROUND ART lightness of electric/electronic devices, the printed circuits are formed in finer, more highly integrated, and smaller patterns on boards, which accordingly require various physical properties for the copper foil used in the printed circuit board.

A composite material for use to produce a flexible board, a high-density mounting multilayer board, and a high-frequency circuit board (hereinafter, collectively referred to as "circuit board" or "printed wiring board") is composed of a conductor (copper foil) and an insulating substrate (including film) to support the conductor. The insulating substrate keeps insulation between the conductors and has strength to support the parts.

In order to increase peel strength to an insulating substrate, conventional methods are adapted to raise ten-point average roughness Rz by increasing the flowing current and the deposit amount of granular copper upon surface treatment. However, these methods are suitable for enhancing peel strength, but do not suit circuit boards for high frequency because excessive treatment of the copper foil surface to raise peel strength brings about hindrance factors to the transmission of high frequency signals, resulting in a bad influence on signal transmission.

Recently, the insulator has gradually decreased in thickness according to the trend of thinning and high integration of substrates for electronic appliances. After deposition of copper foil on such a thin insulating substrate in a compressing and heating condition, the resulting copper clad laminate (CCL) undergoes warpage. Such a warpage problem may further seriously arise as the thickness of the insulating substrate and/or the copper clad laminate is decreased.

To solve such problems, U.S. Pat. No. 6,194,056 discloses a method for manufacturing a high-strength copper foil, using various additives. However, the copper foil manufactured by the method is difficult to use as high frequency foil because it still retains high surface roughness. Furthermore, there is no consideration for reducing warpage after lamination.

DISCLOSURE

Technical Problem

Intensive and thorough research conducted by the present inventors with the aim of solving the problems encountered in the related art resulted in the finding that a change in physical properties of a copper foil before and after lamination has an influence on the occurrence of warpage in the copper clad laminate after lamination.

Accordingly, an aspect of the present disclosure is to provide a surface-treated copper foil which is suitable as a high-frequency foil with superb peel strength to a resin substrate and restrained warpage before and after lamination press, and a copper clad laminate and a printed wiring board, each including the surface-treated copper foil.

Technical Solution

According to an aspect thereof, the present disclosure provides a surface-treated copper foil including a surface-treated layer formed on a raw copper foil thereof and an oxidation preventive layer formed on the surface-treated layer, wherein the surface-treated copper foil contains fine copper particles having an average particle diameter of 100 nm or less in at least one surface thereof and has a change index of 5 or less as calculated by the following equation;

Change index $(Y)$=change of tensile strength $(Y1)$+ change of elongation $(Y2)$ (wherein $Y1=(T1-T2)/(kgf/mm^2)$, $Y2=(E2-E1)/\%$, $T2$ and $E2$ are respectively tensile strength and elongation measured after heat treatment at a pressure of 4.9 Mpa and a temperature of 220° C. for 90 minutes, and $T1$ and $E1$ are tensile strength and elongation measured at room temperature, respectively).

In the present disclosure, the surface-treated copper foil may exhibit a warpage of 0.5 mm or less after being attached to a low-dielectric constant resin (low-DK prepreg), polyimide (PI), hydrocarbon, or polyetrafluoroethylene (PTFE) film to manufacture a copper clad laminate.

In the present disclosure, the surface-treated copper foil has a 10-point average roughness of 0.5 μm or less on at least one surface thereof and a gloss of 200 or higher.

In the present disclosure, the surface-treated copper foil may have an peel strength of 0.5 kgf/cm or higher to a low-dielectric constant resin (low-DK prepreg), polyimide (PI), hydrocarbon, or polyetrafluoroethylene (PTFE) film.

In the present disclosure, the surface-treated copper foil may have a transmission loss (S21) of 3.0 dB/100 mm or less at 20 GHz.

In the present disclosure, the oxidation preventive layer may contain at least one element selected from the group consisting of nickel, cobalt, zinc, tin, and phosphorus and preferably nickel and phosphorus.

According to another aspect thereof, the present disclosure may provide a copper clad laminate in which the surface-treated copper foil is deposited on a resin substrate.

According to a further aspect thereof, the present disclosure may provide a printed wiring board formed using the copper clad laminate.

Advantageous Effects

Provided according to the present disclosure are a surface-treated copper foil which is suitable as a high-frequency foil with superb peel strength to a resin substrate and restrained warpage before and after lamination press, and a copper clad laminate and a printed wiring board, each including the surface-treated copper foil.

BRIEF DESCRIPTION OF DRAWINGS

The above and other aspects, features and advantages of the present disclosure will be more apparent from the following detailed description taken in conjunction with the accompanying drawings, in which.

BEST MODE

Figure 1A:
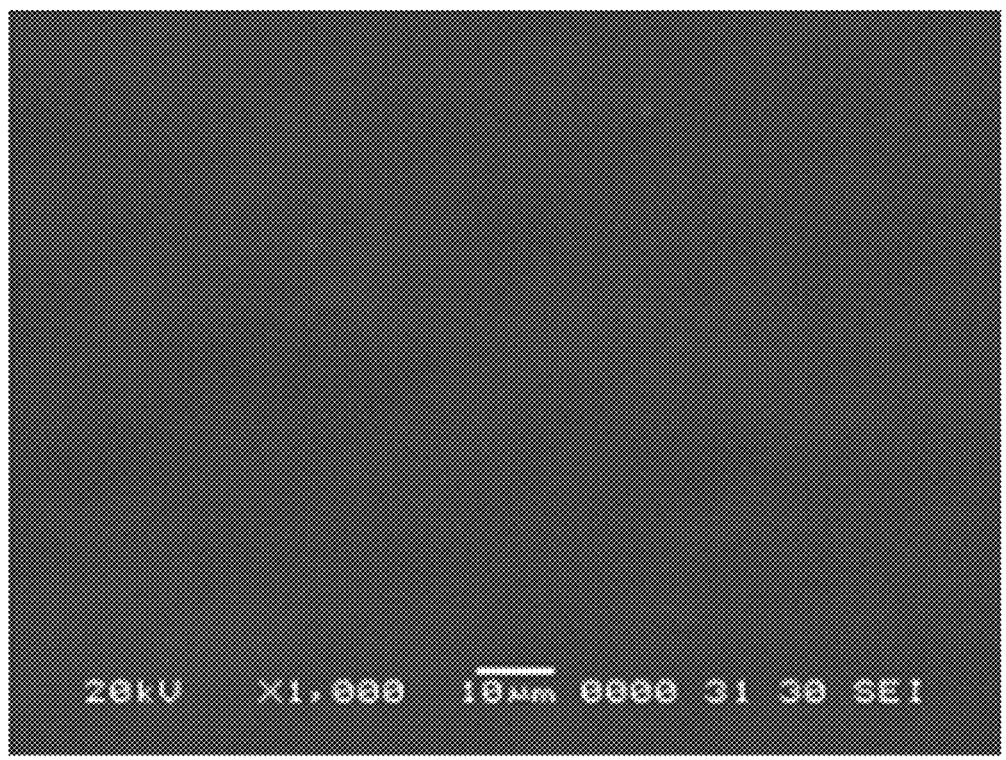
FIGS. 1A and 1B are electron microscopic images of the surfaces of the surface-treated copper foil specimen prepared in the Example before surface treatment and after surface treatment (and oxidation preventive layer formation), respectively.

Accordingly, embodiments and structures illustrated herein are suggested only by way of example but do not represent all technical concepts of the present disclosure. Therefore, it will be understood that various equivalents and modifications may exist which can replace the embodiments described at the time of the application.

Below, a detailed description will be given of the present disclosure with reference to the accompanying drawings.

A surface-treated copper foil of the present disclosure includes a raw foil, a surface-treated layer on at least one surface of the raw foil, and an oxidation preventive layer on the surface-treated layer. The raw foil, the surface-treated layer on at least one surface of the raw foil, and an oxidation preventive layer on the surface-treated layer will be explained in detail below.

A. Raw Foil

So long as it is known in the art, any raw copper foil may be used in the present disclosure, without limitations. According to an embodiment, the raw foil may be an electrodeposited copper foil or a roll copper foil.

In the present disclosure, no particular limitations are imparted to the thickness of the raw foil. When used in a printed wiring board, the surface-treated copper foil may range in thickness from 6 to 35 μm and preferably from 7 to 17 μm.

In a particular embodiment of the present disclosure, the raw foil may have a tensile strength of 35 kgf/mm$^2$ to 60 kgf/mm$^2$, 35 kgf/mm$^2$ to 50 kgf/mm$^2$, or 35 kgf/mm$^2$ to 45 kgf/mm$^2$.

In addition, during the adhesion of the raw foil to a prepreg to form a copper clad laminate or a printed wiring board, the mechanical properties of the raw foil are preferably maintained consistently before and after hot pressing. In the present disclosure, the raw foil undergoes a very small grain change before and after pressing.

For example, the raw foil may have a change of tensile strength of less than 5% or less than 3% after heat treatment at 220° C. under a pressure of 4.9 MPa for a predetermined period of time, relative to the tensile strength at room temperature. In addition, the raw foil may have a change of elongation of less than 5% or less than 3% after heat treatment at 220° C. under a pressure of 4.9 MPa for a predetermined period of time, relative to the tensile strength at room temperature.

B. Surface-Treated Layer

In the present disclosure, the surface-treated layer may be formed on one or both surface of the raw foil. Any method for forming a surface-treated layer may be used without limitations. For example, the surface-treated layer may be formed by electrodepositing the raw foil. In this regard, the electrolyte may be an aqueous solution containing a copper salt at a concentration of 5 to 60 g/L and an additive at a concentration of 50 to 200 g/L, with the pH adjusted to 1 to 8 (e.g., 6 to 7). Examples of the copper salt include copper sulfate ($CuSO_4$), copper nitrate ($Cu(NO_3)_2$), copper chloride ($CuCl_2$), copper acetate ($Cu(CH_3COO)_2$), etc. As the additive, at least one selected from the group consisting of citric acid ($C_6H_8O_7$), ethylenediaminetetraacetic acid ($C_{10}H_{16}N_2O_8$), nitrilotriacetic acid ($C_6H_9NO_6$), sodium citrate ($C_6H_5Na_3O_7$), and tartaric acid ($C_4H_6O_6$) may be used, but with no limitations thereto. The electrodeposition may be conducted, for example, at a current density of 0.5 to 10 A/dm$^2$ for 5 to 20 seconds in an electrolyte solution maintained at 25 to 45° C., with an insoluble electrode and the untreated raw foil serving as a anodic electrode and a cathodic electrode, respectively, in the electrolyte solution, but with no limitations thereto.

C. Oxidation Preventive Layer

In the present disclosure, an oxidation preventive layer may be formed on the surface-treated layer. The oxidation preventive layer may contain nickel (Ni) and phosphorus (P). The oxidation preventive layer may further contain zinc (Zn), cobalt (Co), titanium (Ti), tin (Sn), etc., as needed, in addition to nickel and phosphorus.

The deposit amount of the oxidation preventive layer may be, for example, 30 to 300 mg/m$^2$ and particularly 50 to 120 mg/m$^2$, but with no limitations thereto.

In the present disclosure, no particular limitations are imparted to the formation of the oxidation preventive layer. For example, the oxidation preventive layer may be formed by electrodeposition on the copper foil having the surface-treated layer. By way of instance, an aqueous solution containing a nickel salt at a concentration of 3 to 15 g/L and phosphoric acid ($H_3PO_4$) at a concentration of 15 to 60 g/L may be used. The electrodeposition may be conducted, for example, at a current density of 1 to 5 A/dm$^2$ for 5 to 20 seconds in an electrolyte solution maintained at 25 to 45° C., with an insoluble electrode and the surface-treated copper foil serving as a anodic electrode and a cathodic electrode, respectively, in the electrolyte solution, but with no limitations thereto. Examples of the nickel salt include nickel sulfate ($NiSO_4$), nickel nitrate ($Ni(NO_3)_2$), nickel chloride ($NiCl_2$), and nickel acetate ($C_4H_6NiO_4$), but are not limited thereto.

As described above, the present disclosure provides a surface-treated copper foil including a surface-treated layer formed on at least one surface of a raw copper foil and an oxidation preventive layer formed on the surface-treated layer. In this regard, the surface of the copper foil on which the surface-treated layer is formed may preferably contain fine copper particles with an average particle diameter of 100 nm or less. For instance, the fine copper particles in the surface of the surface-treated copper foil may have an average particle diameter of 10 to 100 nm, 20 to 100 nm, or 50 to 100 nm. In the present disclosure, the average particle diameter of the copper particles may be measured and calculated by analyzing scanning electron microscope (SEM) images of the surface-treated layer. The average value may be calculated from measurements of a total of 100 particles. Given the range, the average particle diameter of the fine copper particles in the surface-treated layer allows the copper foil to be suitable as a high-frequency foil that is superb in peel strength to a resin substrate and low in transmission loss.

In addition, the surface-treated copper foil of the present disclosure preferably has a change index (Y) of 5 or less as calculated by the following equation 1:

Change index (Y)=change of tensile strength (Y1)+ change of elongation (Y2)    (Equation 1)

wherein $Y1=(T1-T2)/(kgf/mm^2)$, $Y2=(E2-E1)/\%$, T2 and E2 are respectively tensile strength and elongation measured after heat treatment at a pressure of 4.9 Mpa and a temperature of 220° C. for 90 minutes, and T1 and E1 are tensile strength and elongation measured at room temperature, respectively. Therefore, the change index (Y) is unitless. In this regard, the surface-treated copper foil may be measured for tensile strength and elongation by using a tensile tester according to IPC-TM-650 2.4.18B.

Within the range satisfying the above-mentioned change index, the surface-treated copper foil of the present disclosure undergoes a small grain change before and after pressing, thereby bringing about the effect of suppressing the warpage occurring upon adhesion to a thin prepreg. More specifically, the change index (Y) may be 4.5 or less, 4.0 or less, or 3.5 or less.

In the present disclosure, the surface-treated copper foil may exhibit a warpage of 0.5 mm or less or particularly 0.4 mm or less after being attached to a low-dielectric constant resin (low-DK prepreg), polyimide (PI), hydrocarbon, or polytetrafluoroethylene (PTFE) film to manufacture a copper clad laminate. In this regard, the warpage may be evaluated by measuring a curling extent (mm) of the copper foil with a steel ruler after cross cutting the central portion of copper clad laminate at a dimension of 50 mm×50 mm.

In the present disclosure, the surface-treated copper foil may have a 10-point average roughness Rz of 0.4 μm or less, 0.5 μm or less, 0.6 μm or less, or 0.7 μm or less. In addition, the 10-point average roughness Rz may be 0.2 μm or more or 0.3 μm or more.

In addition, the surface-treated copper foil may have a gloss (Gs 60°) of 200 or more, 250 or higher, or 300 or higher and less than 400 or 500.

Given the ranges, the copper foil can be suitably used as a high-frequency foil due to the high peel strength to a resin substrate and the low transmission loss. As used herein, the term "10-point average roughness Rz" refers to the 10-point average roughness Rz defined in 5.1 Definition and Presentations of Surface Roughness of JIS B 0601-1994, and the term "gloss (Gs 60°)" may refer to a value obtained by irradiating a surface of a copper foil with measurement light at an incident angle of 60° and measuring the intensity of light reflected at a reflection angle of 60° in accordance with JIS Z 874. For example, the 10-point average roughness Rz of the surface-treated copper foil may be in the range of 0.25 μm to 0.5 μm and particularly in the range of 0.3 μm to 0.45 μm, and the gloss (Gs 60°) may be in the range of 200 to 400 and particularly in the range of about 220 to about 380, but with no limitations thereto.

In the present disclosure, the surface-treated copper foil may have an peel strength of 0.5 kgf/cm or higher to a low-dielectric constant resin (low-DK prepreg), polyimide, hydrocarbon, or polytetrafluoroethylene film. Here, the peel strength may refer to the peel strength measured according to the JIS C6481 standard. By way of example, the surface-treated copper foil may have an peel strength of 0.5 to 1.0 kgf/cm, 0.5 to 2.0 kgf/cm, 0.5 to 3.0 kgf/cm, 0.5 to 4.0 kgf/cm, or 0.5 to 7.0 kgf/cm to a low-dielectric constant resin (low-DK prepreg), polyimide, hydrocarbon, or polytetrafluoroethylene film, but with no limitations thereto.

In the present disclosure, the surface-treated copper foil may exhibit a transmission loss (S21) at 20 GHz of 3.0 dB/100 mm or less. Here, the term "transmission loss (S21) at 20 GHz" refers to the transmission loss measured at 20 GHz measured using a network analyzer in a surface-treated copper foil that is attached to both surfaces of a polytetrafluoroethylene resin and in which microstrip lines are formed with a characteristic impedance of 50Ω provided thereto. By way of example, the surface-treated copper foil may exhibit a transmission loss (S21) at 20 GHz of 0.5 to 3.0 dB/100 mm, 1.0 to 3.0 dB/100 mm, or 1.5 to 2.5 dB/100 mm.

The surface-treated copper foil may be laminated on a resin substrate to construct a copper clad laminate which may be used in fabricating a printed wiring board.

MODE FOR INVENTION

A better understanding of the present disclosure may be obtained via the following examples, which are set forth to illustrate, but are not construed to be as limiting the present disclosure.

EXAMPLES

Example 1

For use in manufacturing a copper foil by electroplating, a 2-L electrolyzer system capable of circulation at a rate of 20 L/min was prepared. In this regard, the copper electrolyte was uniformly maintained at 45° C., and DSE (dimensionally stable electrode) electrode 10 mm thick with a size of 10 cm×10 cm was used as a anodic electrode while a titanium electrode with the same dimensions as in the anodic electrode served as a cathodic electrode.

In order to manufacture an electrodeposited copper foil having a final thickness of 12 μm, first a 11-μm-thick untreated raw foil was prepared. In this regard, an untreated raw foil was prepared at a current density of 35 A/dm² using a copper electrolyte containing copper 100 g/L, sulfuric acid 150 g/L, chlorine ions 30 ppm, polyethylene glycol 30 ppm, bis(3-sulforpropyl)disulfide 40 ppm, sodium 3-(benzothiazoli-2-mercapto)propyl sulfate 40 ppm, and diethylthiourea 2 ppm.

Next, surface treatment was conducted by immersing the untreated raw foil in an aqueous solution containing copper 5 g/L and disodium ethylenediamintetraacetate 200 g/L, followed by plating for 10 seconds under the conditions of solution temperature 25° C., pH 7, and current density 3 A/dm².

Subsequently, an oxidation preventive layer was formed on the surface-treated copper foil in an aqueous solution containing nickel 5 g/L and phosphoric acid 20 g/L under the conditions of solution temperature 40° C., pH 4, and current density 1 A/dm².

Comparative Example 1

A surface-treated copper foil was manufactured in the same manner as in Example 1, with the exception that an untreated raw foil was prepared using a copper electrolyte composed solely of copper 250-400 g/L, sulfuric acid 80-150 g/L, and chlorine ions 1 ppm.

Comparative Example 2

A surface-treated copper foil was manufactured in the same manner as in Example 1, with the exception that the surface treatment was conducted by plating in a copper electrolyte composed of copper 25 g/L and sulfuric acid 150 g/L for 10 seconds under the conditions of solution temperature 30° C., and current density 15 A/dm².

<Property Evaluation>

The surface-treated copper foil samples manufactured in Examples and Comparative Examples were evaluated for physical properties. Evaluation items and methods are as follows.

a. Tensile Strength and Elongation

Tensile Strength and Elongation Before Heat Treatment

Tensile strength and elongation were measured using a tensile tester according to the IPC-TM-650 2.4.18B standard.

Tensile Strength and Elongation after Heat Treatment

After the surface-treated copper foils were pressed using a press at a pressure 4.9 MPa and a temperature of 220° C. for 90 minutes, tensile strength and elongation were measured using a tensile tester according to the IPC-TM-650 2.4.18B standard.

b. 10-Point Average Roughness $R_z$ (Unit: μm)

Using a surface roughness tester, the 10-point average roughness $R_z$ of the copper foils after surface treatment was measured in accordance with the JIS B0601 standard.

c. Average Particle Diameter of Copper Particles (Unit: nm)

After surface treatment, SEM images of each copper foil surface was taken using a scanning electron microscope and was used to measure diameters of 100 copper particles within an area of 100 μm Y 100 μm, followed by calculating the average.

d. Gloss (Gs 60°)

After surface treatment, the copper foil surfaces were measured for gloss according to the JIS Z 8741 standard.

e. Peel Strength (Unit: kgf/cm)

The peel strength of each surface-treated copper foil was measured according to the JIS C6481 standard. The insulator used was that commercially available from Panasonic under the tradename of MEGTRON (R-5785) 40 μm thick.

f. Transmission Loss (S21) (Unit: dB/100 mm)

A 12 μm-thick surface-treated copper foil was attached onto the both surfaces of a polytetrafluoroethylene resin 12 μm thick (AGC Chemicals) and then microstrip lines were formed to have a characteristic impedance of 50Ω, after which transmission loss at 20 GHz was determined using a network analyzer commercially available from HP. S21 nearer to 0 accounts for less transmission loss and thus is more suitable for high-speed transmission.

g. Discoloration Due to Heat

After heat treatment at 220° C.*2 hr in an oven, discoloration was visually determined. The determination was discriminated by marks (O) and (X) for the presence and absence of discoloration, respectively.

h. Copper Foil Warpage

A specimen was fabricated by attaching the surface-treated copper foil onto a 40 μm-thick insulator commercially available from Panasonic Corporation under the tradename of MEGTRON (R-5785) by using a press at a pressure of 4.9 MPa and a temperature of 220° C. for 90 minutes. After a cross-cut with a dimension of 50 mm×50 mm was made with a knife at the central portion of the sample, a curling extent (mm) of the copper foil was measured using a steel ruler.

Figure 1B:
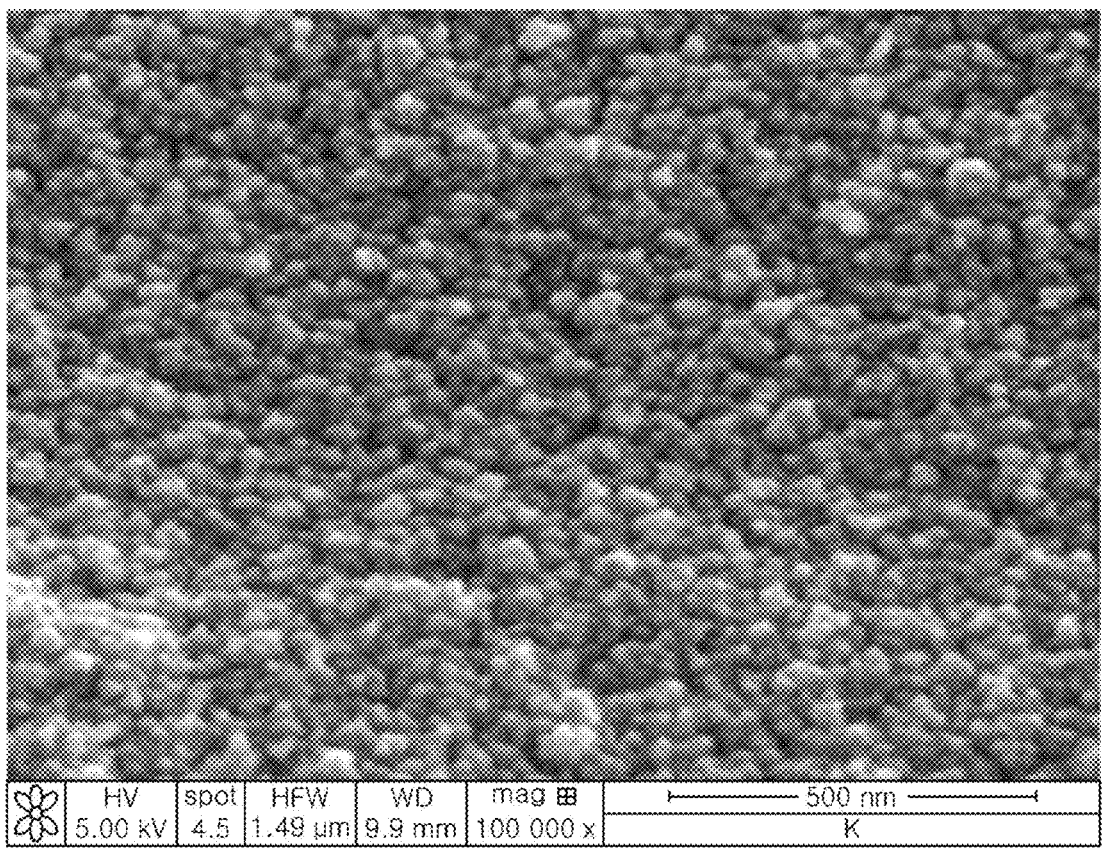

FIGS. 1A and 1B are electron microscopic images of the surfaces of the surface-treated copper foil specimen prepared in the Example before surface treatment and after surface treatment and oxidation preventive layer formation.

With reference to FIGS. 1A and 1B, the specimen of Example 1 has a smooth surface before surface treatment (1a) and exhibits fine copper particles 100 nm or less in size on the surface thereof after surface treatment (1b).

Figure 2A:
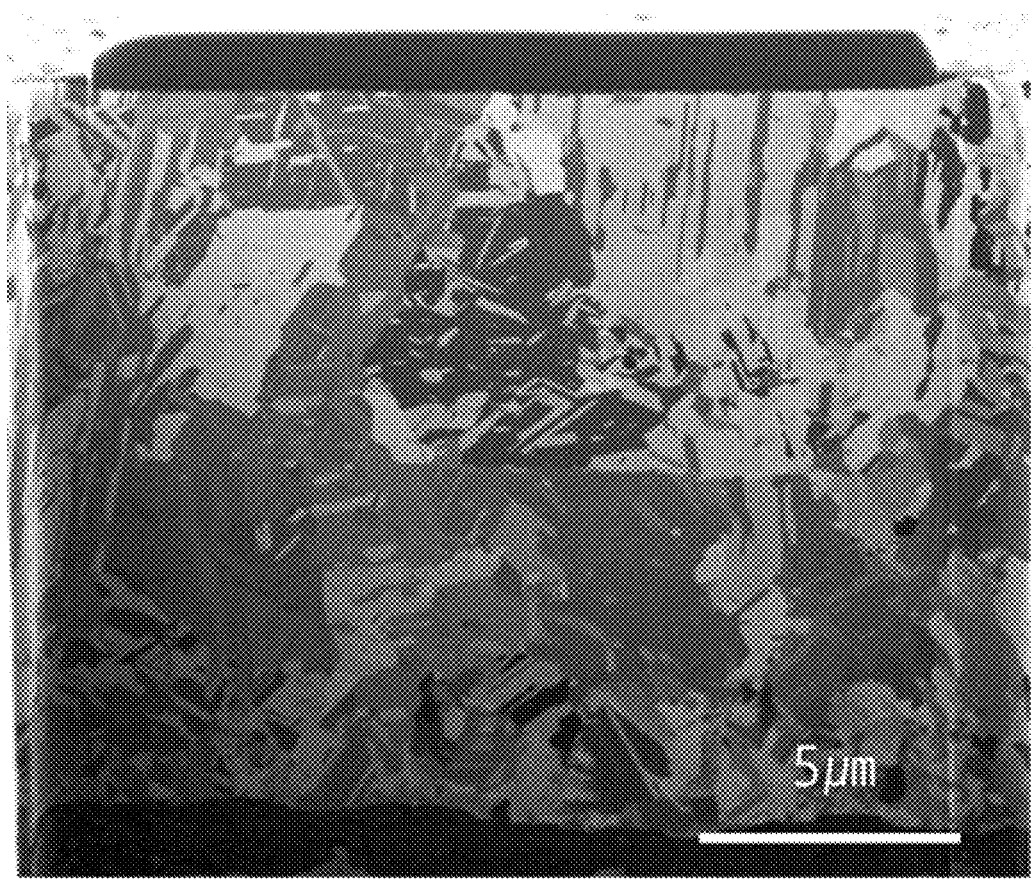
FIGS. 2A and 2B are electron microscopic images, taken by focused ion beam (FIB) microscopy, showing changes of grains on the cross section of the surface-treated copper foil specimen prepared in Example 1 before and after hot pressing, respectively.
Figure 2B:
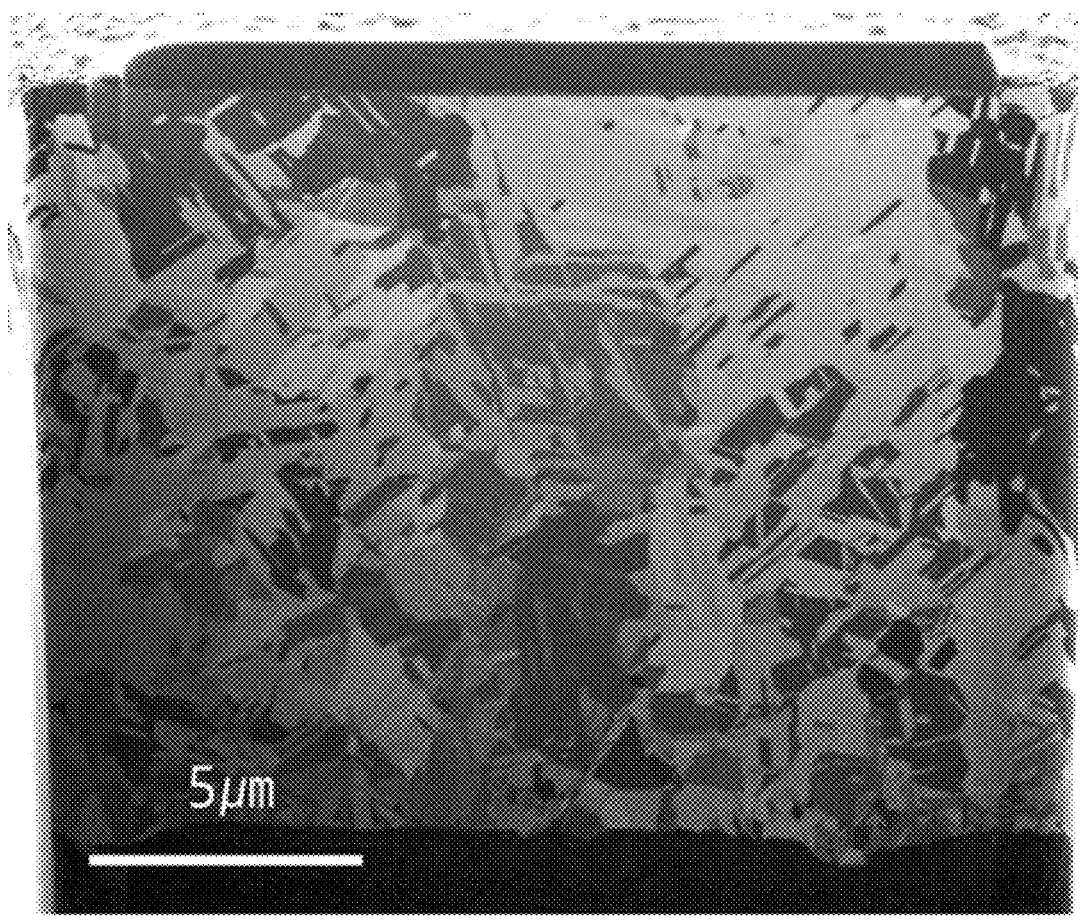

FIGS. 2A and 2B are electron microscopic images, taken by FIB, showing changes of grains on the cross section of the surface-treated copper foil specimen prepared in Example 1 before and after hot pressing, respectively.

With reference to FIGS. 2a and 2b, the specimen did not undergo significant changes in grain morphology and size before (2A) and after (2B) pressing.

Figure 3A:
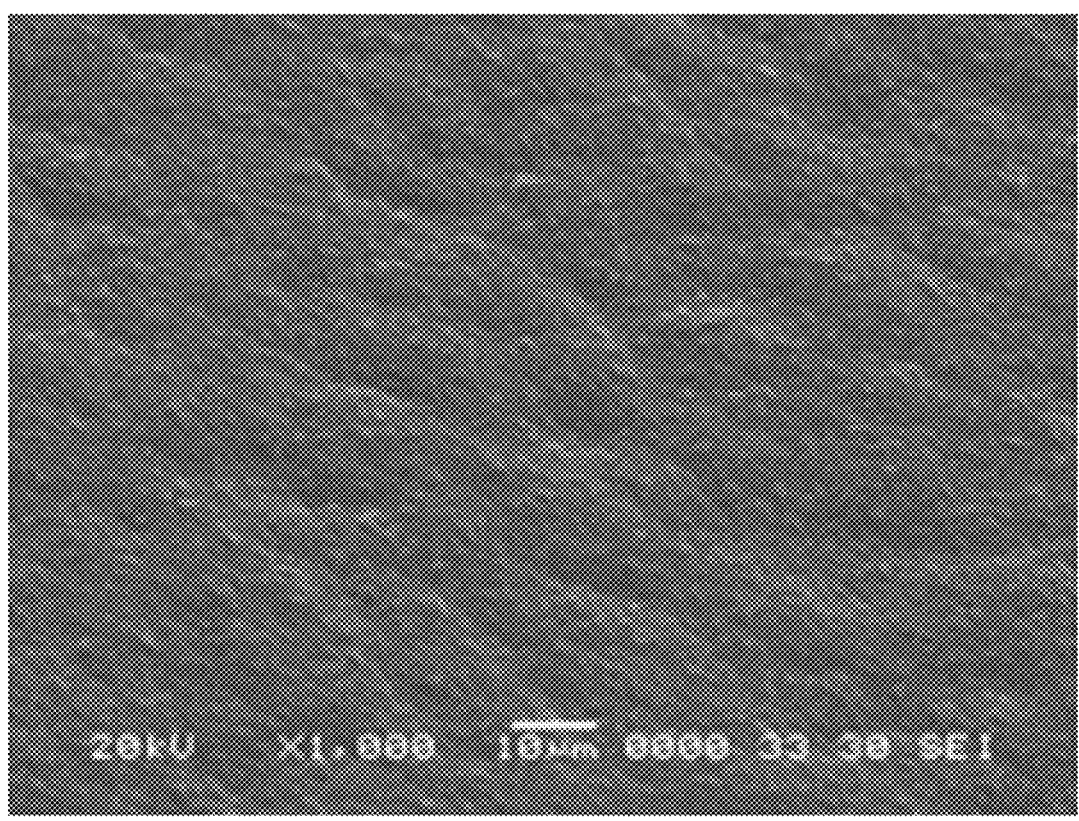
FIGS. 3A and 3B are electron microscopic images of the surfaces of the surface-treated copper foil specimen prepared in Comparative Example 1 before and after surface treatment, respectively.
Figure 3B:
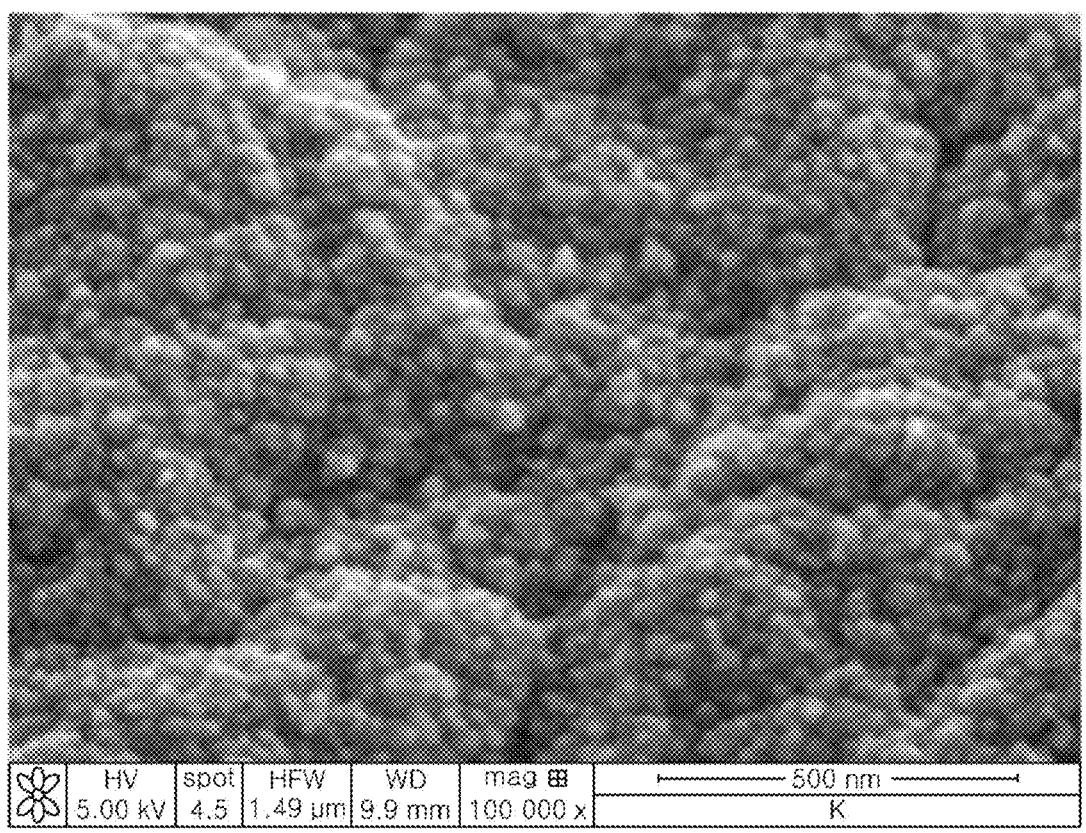
Figure 4A:
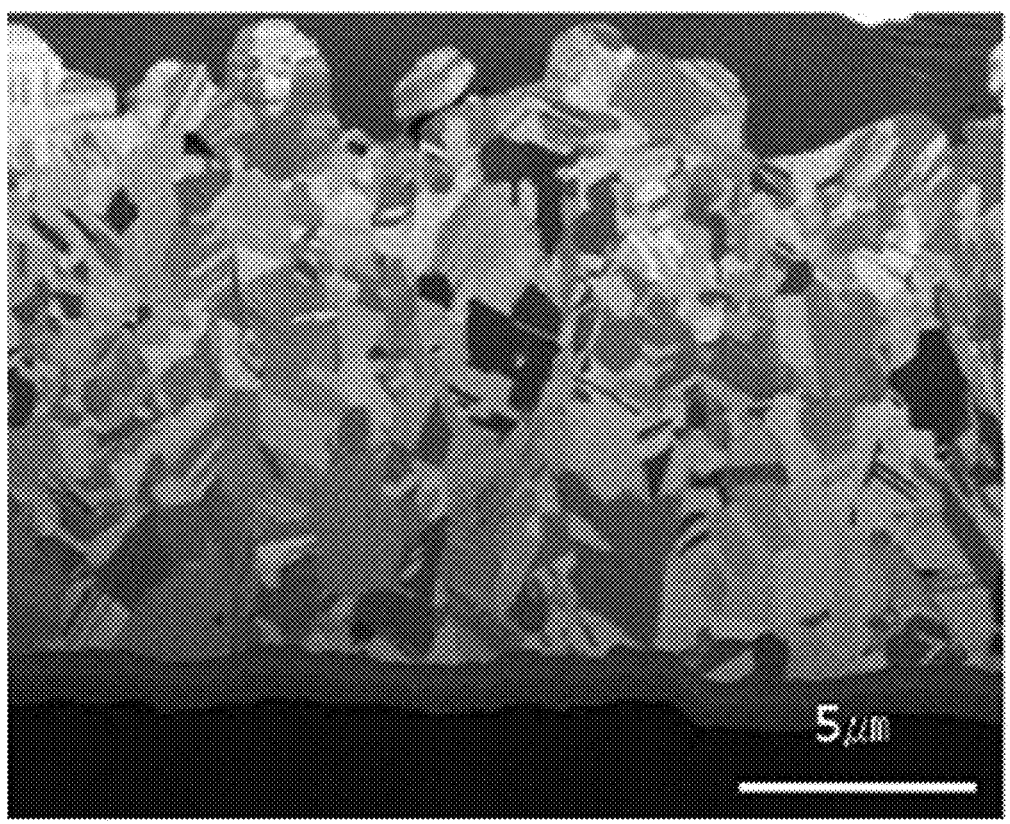
FIGS. 4A and 4B are electron microscopic images, taken by FIB microscopy, showing changes of grains on the surfaces of the surface-treated copper foil specimen prepared in the Comparative Example 1 before and after hot pressing, respectively.
Figure 4B:
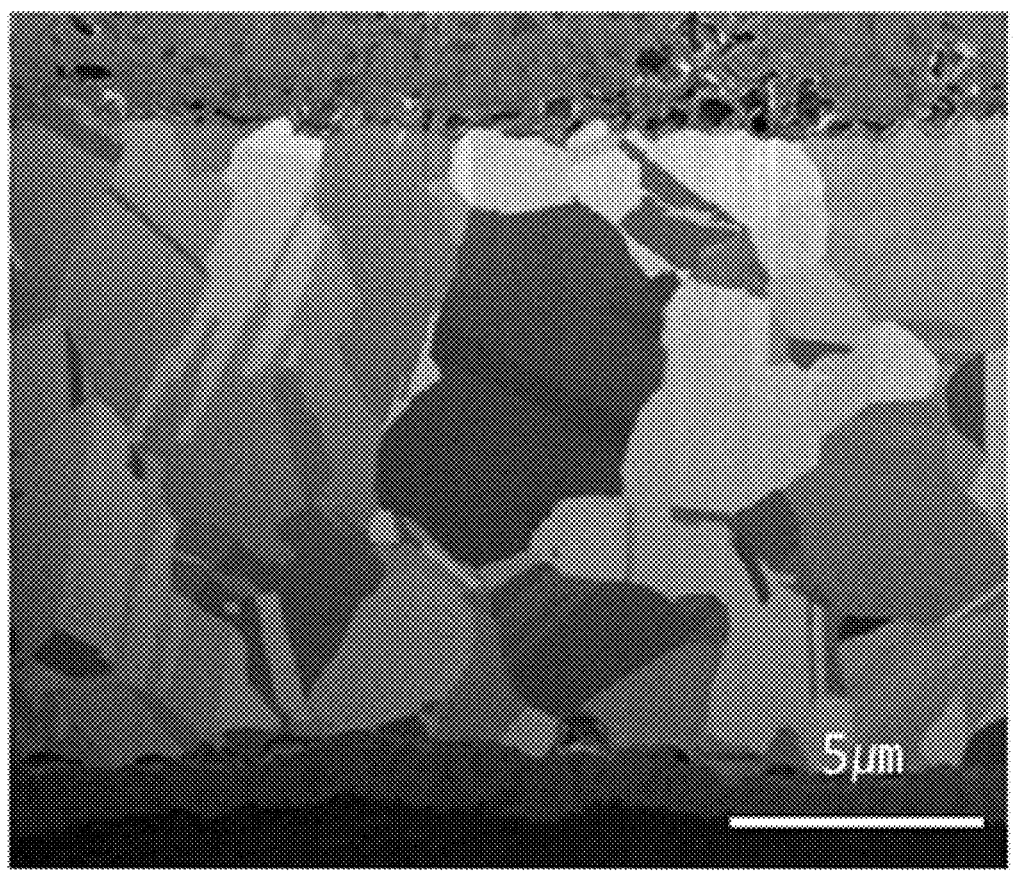

Meanwhile, FIGS. 3A and 3B are electron microscopic images of the surfaces of the surface-treated copper foil specimen prepared in Comparative Example 1 before surface treatment and after surface treatment and oxidation preventive layer formation, respectively. FIGS. 4A and 4B are electron microscopic images, taken by FIB, showing changes of grains on the cross section of the surface-treated copper foil specimen prepared in the Comparative Example 1 before and after hot pressing, respectively.

With reference to FIGS. 3A and 3B, the specimen of Comparative Example 1 exhibits high roughness compared to those before surface treatment (FIG. 3A) and Example (FIG. 1A) and fine copper grains were formed after surface treatment (FIG. 3B). In addition, referring to FIGS. 4A and 4B, the specimen of Comparative Example 1 greatly increased in grain size after pressing (FIG. 4B), compared to that before pressing (FIG. 4A).

Figure 5A:
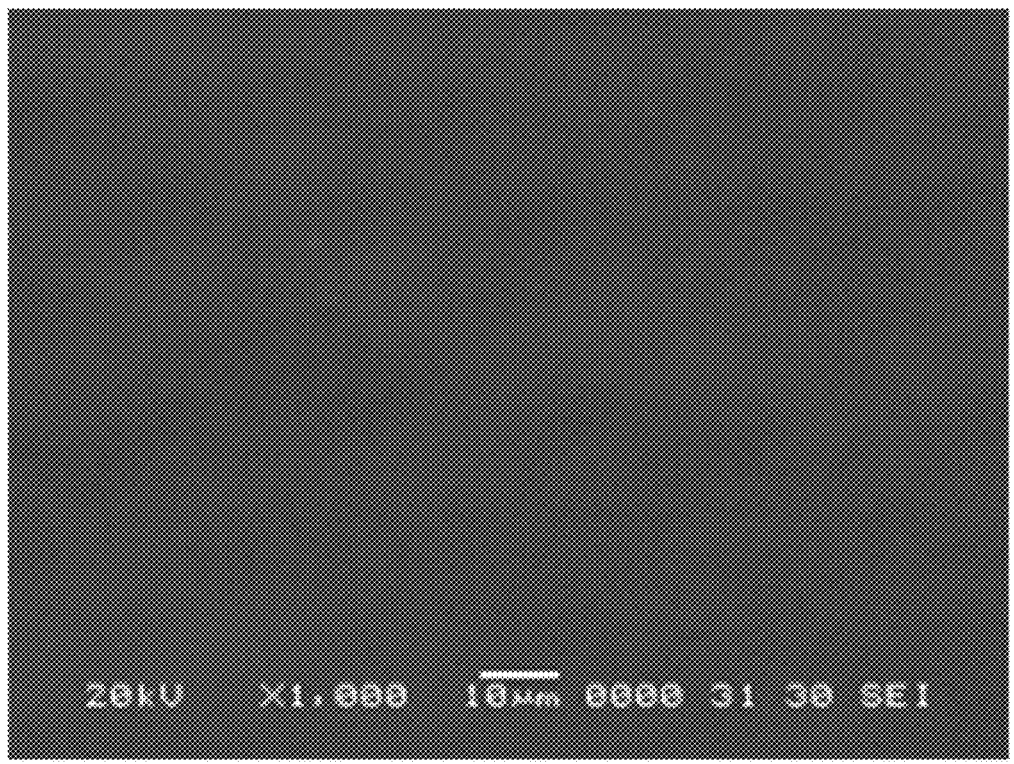
FIGS. 5A and 5B are electron microscopic images of the surfaces of the surface-treated copper foil specimen prepared in Comparative Example 2 before and after surface treatment, respectively.
Figure 5B:
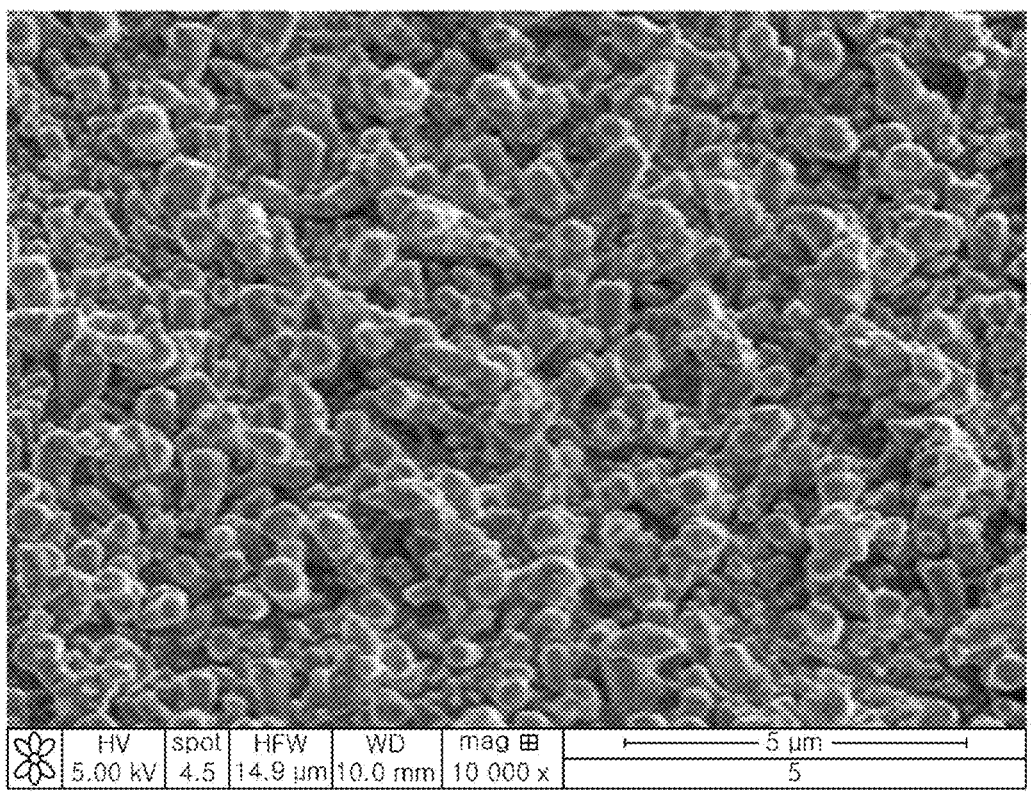

FIGS. 5A and 5B are electron microscopic images of the surfaces of the surface-treated copper foil specimen prepared in Comparative Example 2 before surface treatment (FIG. 5A) and after surface treatment and oxidation preventive layer formation (FIG. 5B). As shown, the specimen of Comparative Example 2 has coarse copper particles formed on the surface thereof after surface treatment and oxidation preventive layer formation (FIG. 5B).

In Table 1, calculation results of change indexes (Y) for the specimens prepared in Example 1 and Comparative Examples 1 and 2 are summarized. Evaluation data for physical properties of the specimens prepared in Example 1 and Comparative Examples 1 and 2 are summarized in Table 2.

TABLE 1

| Ex. No. | Tensile Strength (kgf/mm$^2$) | | | Elongation (%) | | | Change index Y |
|---|---|---|---|---|---|---|---|
| | T1 | T2 | T1 − T2 | E1 | E2 | E2 − E1 | |
| Example 1 | 43.3 | 41.9 | 1.4 | 10.5 | 12.5 | 2 | 3.4 |
| Comparative Example 1 | 53.3 | 23.9 | 29.4 | 5.2 | 16.9 | 11.7 | 51.1 |
| Comparative Example 2 | 41.9 | 40.3 | 1.6 | 11.9 | 12.1 | 0.2 | 1.8 |

TABLE 2

| Ex. No. | Change index (Y) | Treated surface Rz (μm) | Copper grain size (nm) | Gloss (Gs 60°) | Peel strength (kgf/cm) | S21@ 20 Ghz (dB/100 mm) | Copper foil Warpage (mm) |
|---|---|---|---|---|---|---|---|
| Ex. 1 | 3.4 | 0.34 | 67 | 307 | 0.57 | 1.9 | 0.4 |
| C. Ex. 1 | 51.1 | 0.89 | 54 | 69 | 0.32 | 2.7 | 5.8 |
| C. Ex. 2 | 1.8 | 0.79 | 1224 | 63 | 0.71 | 3.8 | 0.6 |

Referring to Tables 1 and 2, Example 1 and Comparative Example 2, the specimens of Example 1 and Comparative Example 1 which exhibited low grain values (Y) before and after hot pressing were observed to undergo lower warpage, compared to Comparative Example 1. In addition, as can be seen in Table 2 and FIGS. 2 to 4, the specimen of Example 1 which has a small warpage underwent a small grain change before and after pressing, unlike the specimen of Comparative Example 1, and the warpage is understood to be related to the morphological change of grains during the hot pressing. Furthermore, the specimen of Example 1 which had high gloss and was surface treated with copper grains is found to be suitable as a high-frequency copper foil due to its high peel strength and low transmission loss at 20 GHz in spite of very low roughness, in contrast to the specimens of Comparative Examples 1 and 2.

Compared to that of Example 1, the specimen of Comparative Example 1 had high roughness on the treated surface thereof, but decreased in peel strength due to a decrease in strength after pressing.

Comparative Example 2 exhibited high peel strength, compared to Example 1, but decreased in transmission loss due to relatively large copper grains and high roughness.

Although not particularly summarized, the specimens of Example 1 and Comparative Examples 1 and 2, which were all provided with an oxidation preventive layer, were determined to be resistant to discoloration.

The above-described embodiments are in all respects as illustrative and non-limiting, it is to be understood that the scope of the present disclosure are described below, rather than the above description appears by the claims, and the scope of the present disclosure is defined by the appended claims rather than the foregoing description and the exemplary embodiments described therein. Various modifications made within the meaning of an equivalent of the claims of the disclosure and within the claims are to be regarded to be in the scope of the present disclosure.

INDUSTRIAL APPLICABILITY

The present disclosure can find applications in electrodeposited copper foils, copper clad laminates, and printed wiring boards.

What is claimed is:

1. A surface-treated copper foil, comprising a surface-treated layer formed on a raw copper foil thereof and an oxidation preventive layer formed on the surface-treated layer,
wherein the surface-treated copper foil contains fine copper particles having an average particle diameter of 100 nm or less in at least one surface thereof and has a change index of 5 or less as calculated by the following equation;

Change index (Y)=change of tensile strength (Y1)+ change of elongation (Y2)

(wherein Y1=(T1−T2)/(kgf/mm$^2$), Y2=(E2−E1)/%, T2 and E2 are respectively tensile strength and elongation measured after heat treatment at a pressure of 4.9 Mpa and a temperature of 220° C. for 90 minute, and T1 and E1 are tensile strength and elongation measured at room temperature, respectively).

2. The surface-treated copper foil of claim 1, wherein the surface-treated copper foil has a warpage of 0.5 mm or less after being attached to a low-dielectric constant resin (low-DK prepreg), polyimide (PI), hydrocarbon, or polytetrafluoroethylene (PTFE) film to manufacture a copper clad laminate.

3. The surface-treated copper foil of claim 1, wherein the surface-treated copper foil has a 10-point average roughness of 0.5 μm or less on at least one surface thereof and a gloss of 200 or higher.

4. The surface-treated copper foil of claim 1, wherein the raw copper foil is an electrodeposited copper foil.

5. The surface-treated copper foil of claim 1, wherein the surface-treated copper foil has a peel strength of 0.5 kgf/cm or higher to a low-dielectric constant resin (low-DK prepreg), polyimide (PI), hydrocarbon, or polytetrafluoroethylene (PTFE) film.

6. The surface-treated copper foil of claim 1, wherein the surface-treated copper foil has a transmission loss (S21) of 3.0 dB/100 mm or less at 20 GHz.

7. The surface-treated copper foil of claim 1, wherein the oxidation preventive layer contains at least one element selected from the group consisting of nickel, cobalt, zinc, tin, and phosphorus and preferably nickel and phosphorus.

8. The surface-treated copper foil of claim 7, wherein the oxidation preventive layer contains nickel and phosphorus.

9. A copper clad laminate in which the surface-treated copper foil of claim 1 is deposited on a resin substrate.

10. A printed wiring board, formed using the copper clad laminate of claim 9.

* * * * *